US006798076B2

(12) United States Patent
Horigan et al.

(10) Patent No.: US 6,798,076 B2
(45) Date of Patent: *Sep. 28, 2004

(54) METHOD AND APPARATUS FOR ENCODING INFORMATION IN AN IC PACKAGE

(75) Inventors: John W. Horigan, Mountain View, CA (US); Larry L. Moresco, San Carlos, CA (US)

(73) Assignee: Intel Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/470,092

(22) Filed: Dec. 21, 1999

(65) Prior Publication Data

US 2003/0116868 A1 Jun. 26, 2003

(51) Int. Cl.⁷ .............................................. H01L 23/48
(52) U.S. Cl. ...................... 257/786; 257/738; 257/773; 257/777; 257/778; 257/780

(58) Field of Search ................... 257/738, 773, 257/777, 778, 780, 786

(56) References Cited

U.S. PATENT DOCUMENTS

| 4,471,408 A | * | 9/1984 | Martinez .................... 174/52.4 |
| 6,040,985 A | * | 3/2000 | Arai et al. .................. 174/255 |
| 6,097,611 A | * | 8/2000 | Samaras et al. ........... 174/16.3 |
| 6,150,724 A | * | 11/2000 | Wenzel et al. .............. 257/777 |
| 6,246,107 B1 | * | 6/2001 | Silvestre ..................... 257/666 |
| 6,429,387 B1 | * | 8/2002 | Kuribayashi et al. ....... 174/261 |

FOREIGN PATENT DOCUMENTS

EP          57645 A1 * 8/1982   ........... H01L/23/00

* cited by examiner

*Primary Examiner*—Tom Thomas
*Assistant Examiner*—Matthew E. Warren
(74) *Attorney, Agent, or Firm*—Blakely, Sokoloff, Taylor & Zafman LLP

(57) ABSTRACT

An integrated circuit (IC) package includes a substrate, a ground line, and an encoded region. The encoded region provides information based upon selective deposition of solder balls electrically coupled to the ground line.

14 Claims, 2 Drawing Sheets

METHOD AND APPARATUS FOR ENCODING INFORMATION IN AN IC PACKAGE

The present invention relates to computer systems and more particularly to an IC package, such as a BGA package, that provides configuration information to the system.

BACKGROUND

Computer systems, from small handheld electronic devices to medium-sized mobile and desktop systems to large servers and workstations, are becoming increasingly pervasive in our society. Computer systems typically include one or more processors. A processor manipulates and controls the flow of data in a computer by executing instructions. To provide more powerful computer systems for consumers, processor designers strive to continually increase the operating speed of the processor. Unfortunately, as processor speed increases, the power consumed by the processor tends to increase as well.

Historically, the power consumed by the processor, and hence its speed, has been limited by two factors. First, as power consumption increases, the processor tends to run hotter, leading to thermal dissipation problems. Second, the power consumed by a processor may tax the limits of the power supply used to keep the processor operational, reducing battery life in mobile systems and diminishing reliability while increasing cost in larger systems. To combat these problems, the voltage supply level used by the processor may be reduced. Therefore, faster and more powerful processors may operate at lower voltage supply levels.

The voltage supply is typically provided to the processor through a component in the computer system called the motherboard. A motherboard is designed to accommodate a particular processor that operates at a particular voltage supply level. When a more advanced processor is introduced that operates at a lower voltage supply level, the motherboard must be redesigned to accommodate the lower voltage supply level. It can be expensive to redesign a motherboard, and this expense is passed on to the end user through the higher cost of a computer.

The present invention addresses this and other problems associated with the prior art.

SUMMARY OF THE INVENTION

In accordance with one embodiment of the present invention, an integrated circuit (IC) package includes a substrate, a ground line, and an encoded region. The encoded region provides information based upon selective deposition of solder balls electrically coupled to the ground line.

Other features and advantages of the present invention will be apparent from the accompanying figures and the detailed description that follows.

BRIEF DESCRIPTION OF THE DRAWINGS

The present invention is illustrated by way of example and not limitation in the accompanying figures in which like references indicate similar elements and in which.

DETAILED DESCRIPTION

In accordance with one embodiment of the present invention, a ball grid array (BGA) package includes an integrated circuit (IC), such as a processor, in a substrate. An encoded region of the package provides information using selectively deposited solder balls in the encoded region. This information may indicate, for example, a voltage supply level for the processor.

Deposited solder balls in the encoded region are coupled to a ground line within the package. When the package is coupled to a printed circuit board (PCB), such as a motherboard, deposited solder balls in the encoded region are coupled to a power supply via resistors and a power trace on the motherboard. In this manner, the presence or absence of a solder ball in the encoded region can be sensed by the motherboard. Thus, the information is automatically provided to the system to properly configure the voltage supply level to the processor.

In accordance with an embodiment of the present invention, a single motherboard can be designed that accommodates various processors requiring different voltage supply levels. The proper voltage supply level is indicated to the motherboard by selective deposition of solder balls in the encoded region of the processor package in the manner described above. Thus, system cost is reduced because there is no need to design different motherboards for each different processor. A single, mass-produced motherboard may be used. A more detailed description of embodiments of the present invention, including various configurations and implementations, is provided below.

Figure 1A:
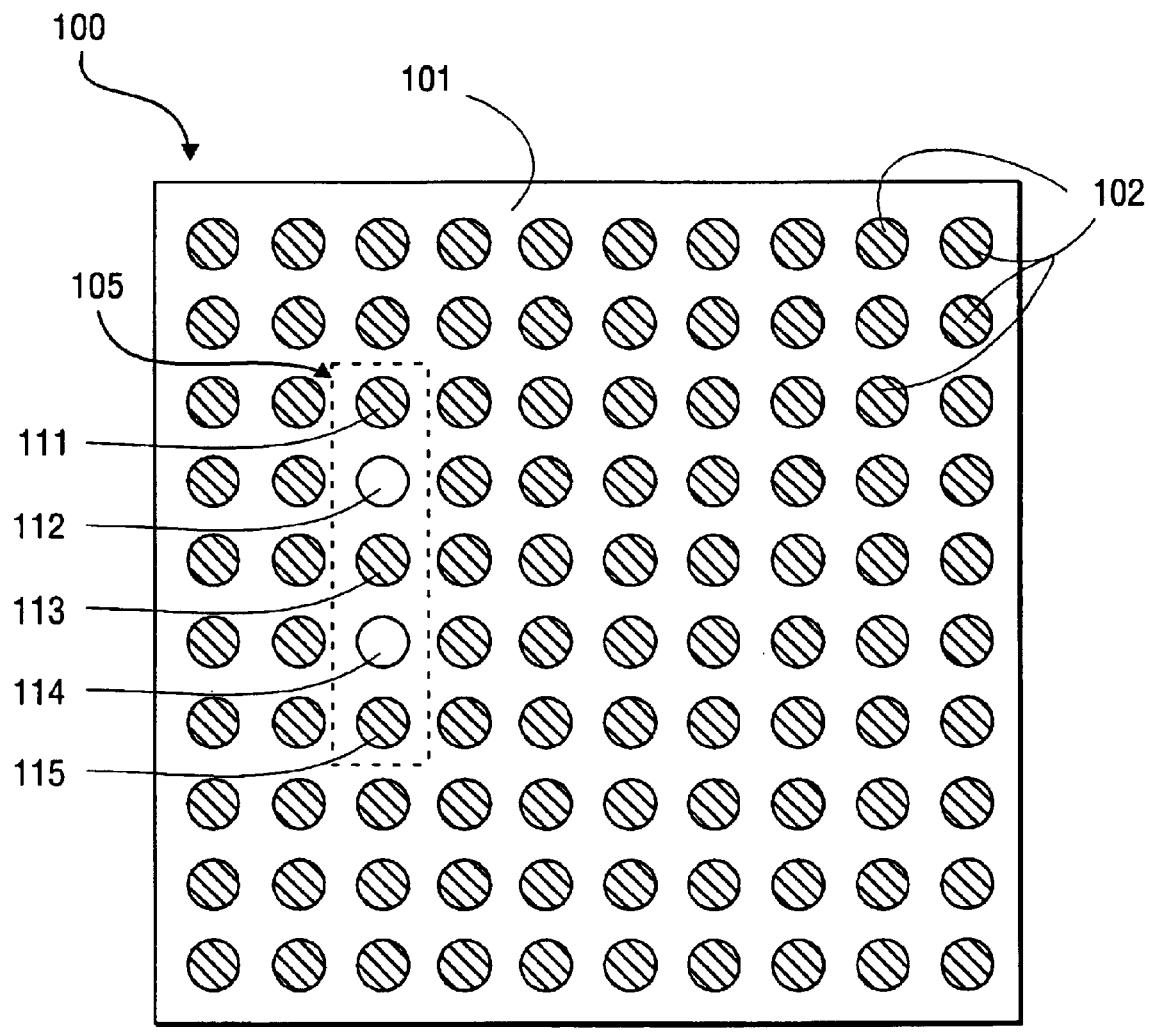
FIG. 1A is a BGA package formed in accordance with an embodiment of the present invention.

FIG. 1A is a BGA package, 100, formed in accordance with an embodiment of the present invention. As used herein, a BGA package is intended to refer to any IC package that includes I/O, power, or ground ports formed of electrically conductive balls that are deposited onto a substrate in any pattern through a template. Electrically conductive balls are herein referred to as solder balls, and include not only electrically conductive balls but also electrically conductive bumps, cylinders, parallelepipeds, ellipsoids, or any other electrically conductive shape.

BGA package 100 of FIG. 1A includes substrate 101 and solder balls 102. Note that to avoid obscuring FIG. 1A, reference numeral 102 only points to 4 of the numerous solder balls shown. Substrate 101 includes one or more ICs (not shown) having I/O, power, or ground pads that are electrically coupled to solder balls 102. In accordance with one embodiment of the present invention, substrate 101 includes a processor.

The surface of substrate 101 of BGA package 100 of FIG. 1A may include an electrically insulative (dielectric) material, such as plastic or ceramic. Onto this surface, solder balls 102 may be screen printed. This screening process includes screen printing solder, or another electrically conductive material, through a template (or "screen") that has openings adjacent to portions of the substrate where solder balls are deposited. Solder balls are prevented from being deposited on portions of the substrate adjacent to closures in the template. For an alternate embodiment of the present invention, solder balls are deposited on the substrate of a BGA package through a template by a process other than screening such as, for example, chemical vapor deposition and sputtering.

The ease and economy with which the solder ball pattern on a BGA package can be modified makes embodiments of the present invention advantageous over, for example, IC redesign, IC pad bond-out, or internal package redesigns.

Templates used to form alternate solder ball patterns on a BGA package can be relatively cheaply and quickly produced. Thus, information specific to a particular BGA package (and, more particularly, specific to the IC contained within the package) may be cheaply and easily encoded by the selective deposition of solder balls using package-specific templates.

BGA package 100 of FIG. 1A includes encoded region 105. For the embodiment shown, encoded region 105 includes five solder ball areas 111, 112, 113, 114, and 115. Each of these solder ball areas may or may not include a solder ball, depending on the information one desires to encode. For the embodiment of FIG. 1A, solder balls are shown deposited in solder ball areas 111, 113, and 115, and solder balls are absent from solder ball areas 112 and 114. If a solder ball is deposited in a solder ball area of the encoded region, it denotes one logic level, and the absence of a solder ball from the solder ball area denotes the opposite logic level.

Thus, the solder ball pattern in encoded region 105 of FIG. 1A denotes the five bit binary number "01010" assuming that a deposited solder ball denotes a logical "0" and that the bits are to be read linearly within the encoded region. For an alternate embodiment of the present invention, a deposited solder ball denotes a logical "1", in which case the solder ball pattern in encoded region 105 denotes the five bit binary number "10101", still assuming that the bits are to be read linearly. Alternatively, the bits may be read non-linearly according to a predefined sequence.

According to an embodiment of the present invention, the encoded region of a BGA package is a predefined region that provides information based upon the selective deposition of solder balls in the region. The region may encompass any number of solder ball areas that may or may not be adjacent to one another. The information may be provided visually to either a human observer or to an optical scanner. Alternatively, the information may be provided to a PCB to which the BGA package is coupled, as described below. The information may indicate, for example, a voltage supply level to be provided to the IC in the BGA package, a clock frequency, or other configuration information.

Figure 1B:
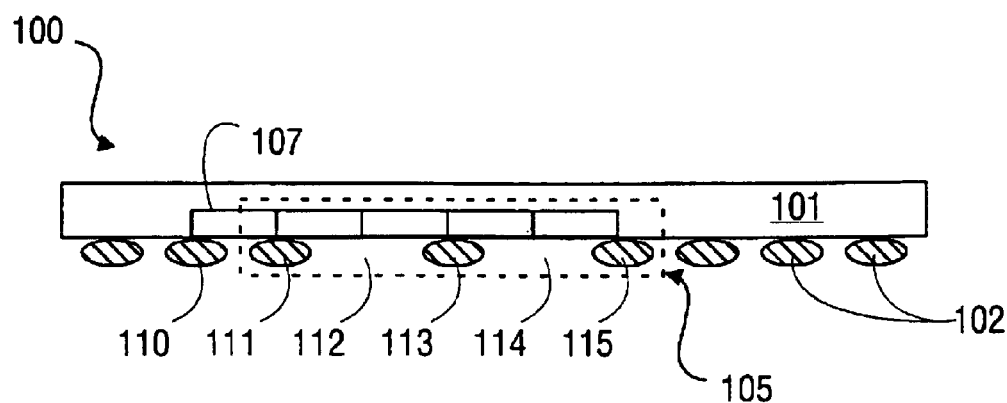
FIG. 1B is a cross-section of the package of FIG. 1A.

FIG. 1B is a cross-section of the package of FIG. 1A through encoded region 105. As shown, substrate 101 of BGA package 100 includes a ground line 107 to which solder ball 110 is electrically coupled. In addition, any solder balls deposited in solder ball areas 111–115 of encoded region 105, such as the solder balls in solder ball areas 111, 113, and 115, are coupled to ground line 107. A ground line is an electrical interconnect that is to be electrically coupled to ground during operation of the IC within the BGA package. Ground line 107 is electrically coupled to ground via solder ball 110 as described below in conjunction with FIG. 2. One type of ground line is a ground plane.

For an alternate embodiment of the present invention, any solder balls deposited in the solder ball areas of an encoded region of a BGA package are coupled to a power line. A power line is an electrical interconnect that is to be electrically coupled to a voltage (or power) supply, such as Vcc, during operation of the IC within the BGA package. One type of power line is a power plane. For an embodiment in which selectively deposited solder balls in an encoded region of a BGA package are electrically coupled to a power line, the circuit of FIG. 2 may be appropriately modified to electrically determine the presence or absence of solder balls in solder ball areas of the encoded region.

Figure 2:
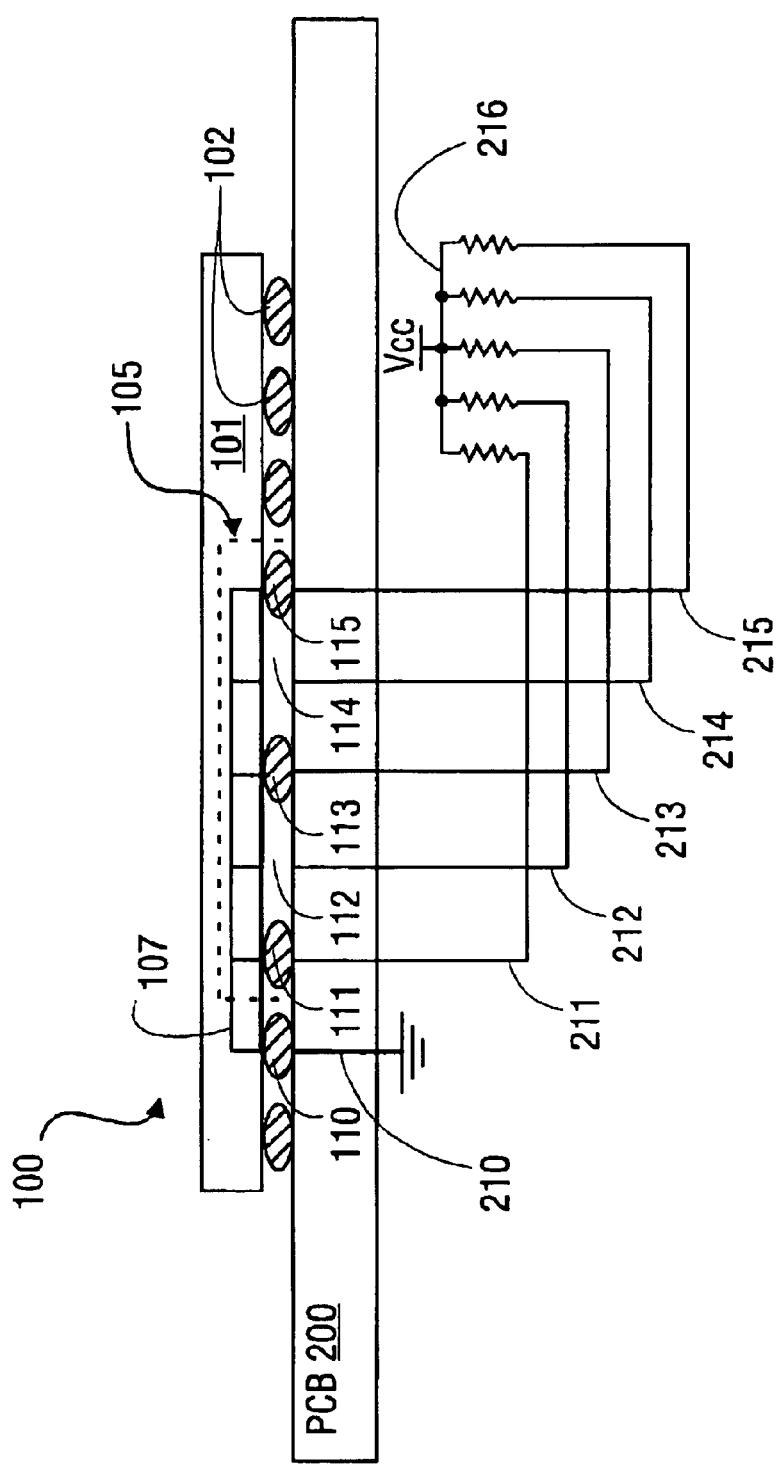
FIG. 2 is the package of FIG. 1A coupled to a PCB to form a component of a computer system in accordance with an embodiment of the present invention.

FIG. 2 is the package of FIG. 1A coupled to PCB 200 to form a component of a computer system in accordance with an embodiment of the present invention. PCB 200 may be the motherboard of the computer system. The electrical interconnects that are shown outside of BGA package 100 in FIG. 2 are actually traces that may be formed on or in PCB 200.

PCB 200 of FIG. 2 includes ground trace 210 electrically coupled to solder ball 110. Ground trace 210 is electrically coupled to ground during operation of the computer system. PCB 200 further includes traces 211, 212, 213, 214, and 215 electrically coupled to any solder balls deposited in solder ball areas 111, 112, 113, 114, and 115, respectively. For example, for the embodiment shown in FIG. 2, the solder ball deposited in solder ball area 111 of encoded region 105 is electrically coupled to trace 211. The solder ball deposited in solder ball area 113 is electrically coupled to trace 213. The solder ball deposited in solder ball area 115 is electrically coupled to trace 215.

Each of traces 211–215 of FIG. 2 is coupled to a node of a resistor disposed on PCB 200, one resistor per trace. The other nodes of the resistors are coupled to power trace 216 formed on PCB 200. Power trace 216 is electrically coupled to a voltage (or power) supply, such as Vcc, during operation of the computer system.

When a voltage is supplied to power trace 216 and ground trace 210 is grounded, the voltage levels on traces 211–215 of FIG. 2 indicate the presence or absence of a solder ball in a solder ball area of encoded region 105. These voltage levels denote the logical levels of the binary information provided from BGA package 100 to PCB 200 based on the selective deposition of solder balls in the encoded region. For example, during operation, the voltage on traces 211, 213, and 215 is approximately ground, and the voltage on traces 212 and 214 is approximately Vcc. Thus, as stated above, the binary number 01010 is denoted by the solder ball pattern in encoded region 105, assuming positive logic is used and the bits are to be read linearly within the encoded region.

This binary number may be used by PCB 200 of FIG. 2, or any other component of the computer system, to, for example, properly configure a voltage supply level provided to the IC within BGA package 100. Alternatively, the information may be used to, for example, properly configure another IC within the computer system to operate at the proper bus speed to enable communication with the IC within BGA package 100.

This invention has been described with reference to specific exemplary embodiments thereof. It will, however, be evident to persons having the benefit of this disclosure that various modifications and changes may be made to these embodiments without departing from the broader spirit and scope of the invention. The specification and drawings are, accordingly, to be regarded in an illustrative rather than a restrictive sense.

What is claimed is:

1. An integrated circuit (IC) package comprising:
    a substrate including an IC;
    a ground line; and
    an encoded region to provide information based upon selective deposition of solder balls electrically coupled to the ground line.

2. The package of claim 1, wherein the substrate is the substrate of a ball grid array (BGA) package.

3. The package of claim 2, wherein the IC is a processor.

4. The package of claim 3, wherein a deposited solder ball in a solder ball area of the encoded region is used to denote a logical "0", and an absence of a solder ball in the solder ball area is used to denote a logical "1".

5. The package of claim 4, wherein the encoded region includes at least three solder ball areas.

6. The package of claim 5, wherein the information indicates a voltage supply level for the IC.

7. The package of claim 1, wherein the information indicates a voltage supply level for the IC.

8. An electronic component comprising:
a ball grid array (BGA) package including an encoded region to provide information based upon selective deposition of solder balls; and
a printed circuit board (PCB) coupled to the package.

9. The component of claim 8, wherein the BGA package contains a processor.

10. The package of claim 9, wherein a deposited solder ball in a solder ball area of the encoded region is used to denote a logical "0", and an absence of a solder ball in the solder ball area is used to denote a logical "1".

11. The package of claim 8, wherein any deposited solder ball in a solder ball area of the encoded region is electrically coupled to a first node of a resistor on the PCB, and a second node of the resistor is electrically coupled to a power trace on the PCB.

12. The package of claim 11, wherein the first node is approximately ground if a solder ball is deposited in the solder ball area, and the first node is approximately Vcc if a solder ball is absent from the solder ball area.

13. The package of claim 12, wherein the encoded region includes at least three solder ball areas.

14. The package of claim 13, wherein the information indicates a voltage supply level for a processor within the BGA package.

* * * * *